United States Patent
Yun

(10) Patent No.: US 8,212,333 B2
(45) Date of Patent: Jul. 3, 2012

(54) MIM CAPACITOR OF SEMICONDUCTOR DEVICE AND MANUFACTURING METHOD THEREOF

(75) Inventor: Jong-Yong Yun, Gangnam-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 215 days.

(21) Appl. No.: 12/624,776

(22) Filed: Nov. 24, 2009

(65) Prior Publication Data

US 2010/0155890 A1   Jun. 24, 2010

(30) Foreign Application Priority Data

Dec. 19, 2008  (KR) .................. 10-2008-0129839

(51) Int. Cl.
*H01L 29/00* (2006.01)
(52) U.S. Cl. ............... 257/532; 257/E29.343; 438/396
(58) Field of Classification Search .............. 257/532, 257/E29.343, E21.008; 438/396
See application file for complete search history.

(56) References Cited

U.S. PATENT DOCUMENTS

| 7,632,755 | B2 * | 12/2009 | Kim ........................ 438/669 |
| 2006/0125048 | A1 * | 6/2006 | Miki ........................ 257/532 |
| 2010/0314765 | A1 * | 12/2010 | Liang et al. ............... 257/751 |

* cited by examiner

*Primary Examiner* — Phuc Dang
(74) *Attorney, Agent, or Firm* — Sherr & Vaughn, PLLC

(57) ABSTRACT

A method of manufacturing a MIM capacitor of a semiconductor device and a MIM capacitor. A MIM structure and a metal layer may be formed using a single process. A method of manufacturing a MIM capacitor may include forming a hole on and/or over a lower metal wire region. A method of manufacturing a MIM capacitor may include forming a lower metal layer, an inter-metal dielectric and/or an upper metal layer on and/or over a hole to form a MIM structure. Patterns to form a MIM structure and a metal layer may be formed at substantially the same time. If etching is performed with a photoresist pattern as a mask, a MIM structure and a metal layer structure may be formed at substantially the same time using a single mask.

20 Claims, 3 Drawing Sheets

US 8,212,333 B2

MIM CAPACITOR OF SEMICONDUCTOR DEVICE AND MANUFACTURING METHOD THEREOF

The present application claims priority under 35 U.S.C. 119 to Korean Patent Application No. 10-2008-0129839 (filed on Dec. 19, 2008) which is hereby incorporated by reference in its entirety.

BACKGROUND

Embodiments relate to a method of manufacturing a semiconductor device and devices thereof. Some embodiments relate to a MIM capacitor of a semiconductor device and methods of forming the same.

Capacitors may be used in semiconductor devices and may be classified as PIP (Poly Insulator Poly) capacitors and/or MIM capacitors, for example depending on a structure. Such capacitors may have unique characteristics and/or may be selectively used in accordance with characteristics of semiconductor devices. A MIM capacitor may be employed in a semiconductor device which may use a relatively high frequency. A PIP capacitor may have an upper electrode and/or a lower electrode, which may include conductive polysilicon. Oxidization may occur at an interface between an upper electrode and/or lower electrode and a thin insulator film, which may minimize capacitance. A MIM capacitor may have minimized resistivity, substantially no parasitic capacitance due to internal depletion and/or relatively high capacitance. In a semiconductor device using a relatively high frequency, device characteristics may vary due to RC delay, and a MIM capacitor including a metal having a maximized electrical characteristic may be used.

Figure 1A:
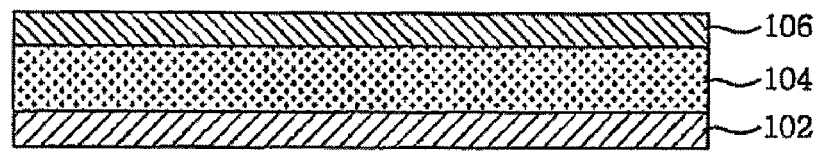
Figure 1B:
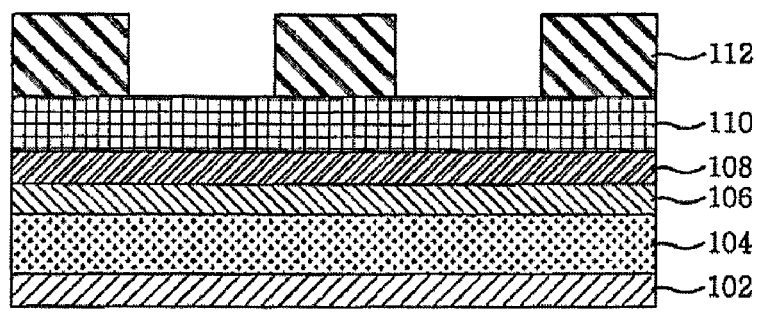

A MIM capacitor may be implemented at substantially the same time with a different semiconductor device to be electrically connected to the semiconductor device through a metal interconnect serving as a connection wire. Example FIG. 1A to FIG. 1D are views illustrating a method of forming a MIM structure and/or a metal layer. Referring to FIG. 1A, a lower metal wire may be formed on and/or over an oxide film, which may be formed on and/or over a semiconductor substrate. First TiN layer 102 may be formed, aluminum (Al) layer 104 may be formed and/or second TiN layer 106 may be formed, for example on and/or over formed aluminum layer 104. Referring to FIG. 1B, SiN layer 108 may be formed on and/or over second TiN layer 108, and/or third TiN layer 110 may be formed. First photoresist pattern 112 may be formed on and/or over third TiN 110, such that a MIM structure may be formed.

Figure 1C:
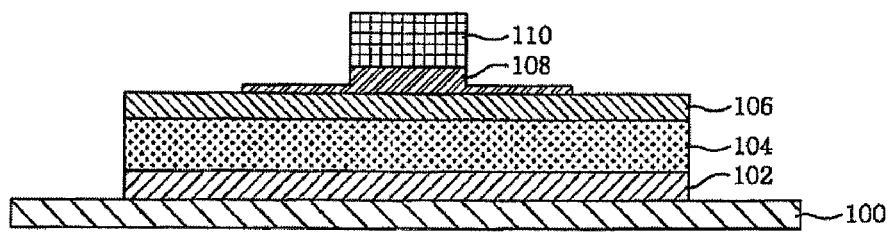
Figure 1D:
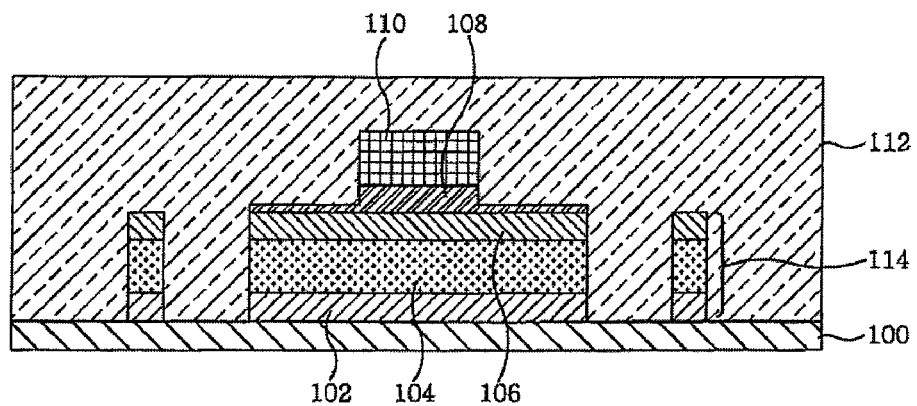

Referring to FIG. 1C, etching may be performed using first photoresist pattern 112 as a mask. A MIM structure may be formed on and/or over oxide film 100 of a semiconductor substrate. Referring to FIG. 1D, selective etching may be performed using a second photoresist pattern as a mask to form a metal layer. Metal layer 114 may be formed, and/or an inter-metal dielectric (IMD) 112 may be deposited on and/or over a surface, which may be the entire surface, of a semiconductor substrate. A MIM structure (106, 108, 110) and/or metal layer 114 may be formed.

In a method of manufacturing a MIM capacitor, photoresist patterns to form a MIM structure and/or subsequent metal layers may be formed individually. In addition, the process may use photoresist patterns as masks. In forming a MIM structure and/or a metal layer, a MIM capacitor and/or a subsequent metal layer may be formed separately. Two masks may need to be provided to form a MIM pattern and/or a metal pattern. Therefore, process time may be maximized, for example to form a metal layer.

Accordingly, there is a need for a method of manufacturing a MIM structure and devices thereof, which may minimize process time. There is a need of method of manufacturing a MIM capacitor, and devices thereof, that may form a MIM structure, for example within a hole with a single process, to form a metal/insulator/metal (MIM) structure and/or a subsequent metal layer structure.

SUMMARY

Embodiments relate to a MIM capacitor of a semiconductor device and a method of manufacturing an MIM capacitor. According to embodiments, a MIM capacitor may be configured to form a MIM structure and/or a metal layer using a single process. In embodiments, a MIM capacitor of a semiconductor device and a method of manufacturing a MIM capacitor may be configured to form a MIM structure within a hole using a single process during forming a MIM structure and/or a metal layer. In embodiments, a MIM capacitor and a method of manufacturing a MIM capacitor may be configured to form a MIM structure and/or a metal layer at substantially the same time, for example within a hole, using a single photoresist pattern.

Embodiments relate to a MIM capacitor of a semiconductor device. According to embodiments, a MIM capacitor may include a lower metal wire formed on and/or over a semiconductor substrate. In embodiments, a MIM capacitor may include an oxide film formed on a surface, which may be an entire surface, of a semiconductor substrate on and/or over which a lower metal wire may be formed. In embodiments, a MIM capacitor may include a lower metal layer filled in a hole which may be formed on and/or over an oxide film, which may be to a lower metal wire region. In embodiments, a MIM capacitor may include an inter-metal dielectric formed on and/or over an etched lower metal layer region, which may be obtained by etching a lower metal layer at a prescribed depth. In embodiments, a MIM capacitor may include an upper metal layer formed on and/or over an inter-metal dielectric.

Embodiments relate to a method of manufacturing a MIM capacitor. According to embodiments, a method of manufacturing a MIM capacitor may include forming a lower metal wire on and/or over a semiconductor substrate. In embodiments, a method of manufacturing a MIM capacitor may include forming an oxide film on and/or over a surface, which may be an entire surface, of a semiconductor substrate on and/or over which a lower metal wire may be formed. In embodiments, a method of manufacturing a MIM capacitor may include forming a hole on and/or over an oxide film, which may be to a lower metal wire region. In embodiments, a method of manufacturing a MIM capacitor may include filling a lower metal layer on and/or over a hole. In embodiments, a method of manufacturing a MIM capacitor may include etching a filled lower metal layer to a prescribed depth. In embodiments, a method of manufacturing a MIM capacitor may include forming an inter-metal dielectric on and/or over an etched lower metal layer region. In embodiments, a method of manufacturing a MIM capacitor may include forming an upper metal layer on and/or over a inter-metal dielectric.

According to embodiments, a MIM capacitor structure and a metal layer may be formed using a single process. In embodiments, a number of masks used may be minimized. In embodiments, a process may be relatively simplified, and/or a structure may be achieved. In embodiments, productivity may be maximized.

DRAWINGS

Example FIG. 1A to FIG. 1D are views illustrating a method of manufacturing a MIM structure and a metal layer.

Example FIG. 2A to FIG. 2E are views illustrating a method of manufacturing a MIM structure and a metal layer in accordance with embodiments.

DESCRIPTION

Embodiments relate to a method of manufacturing a MIM capacitor. According to embodiments, a MIM structure and a metal layer may be formed using a single process. In embodiments, a MIM structure and a metal layer may be formed at substantially the same time using a single photoresist pattern. In embodiments, a MIM structure and a metal layer may be formed at substantially the same time using a single photoresist pattern as a mask. In embodiments, a MIM structure may be formed on and/or over a hole. In embodiments, a hole may be formed on and/or over a lower metal wire region. In embodiments, a lower metal layer, a inter-metal dielectric and/or an upper metal layer may be formed, for example sequentially, on and/or over a hole to form a MIM structure. In embodiments, a pattern may be formed using photoresist which may be employed to form a MIM structure, and/or patterns to form a MIM structure and a metal layer may be formed at substantially the same time. In embodiments, if etching is performed including a photoresist pattern as a mask in accordance with embodiments, a MIM structure and a metal layer may be formed using a single mask.

Figure 2A:
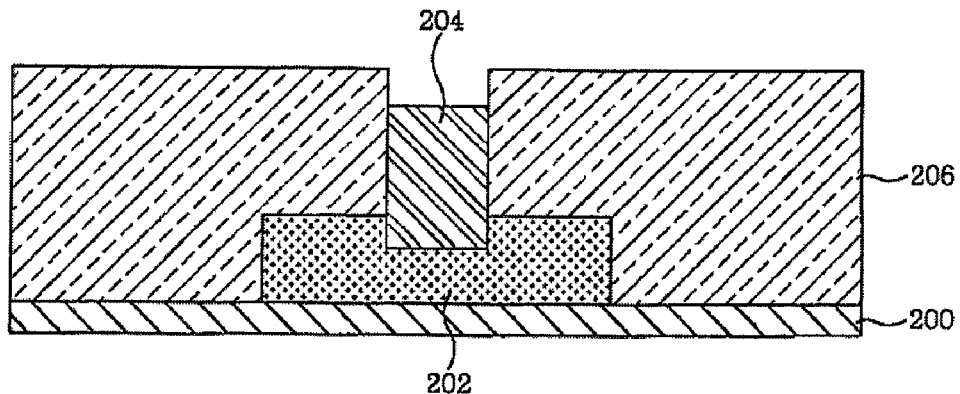

Referring to example FIG. 2A to FIG. 2E, views illustrate a method of manufacturing a MIM structure and a metal layer in accordance with embodiments. Referring to FIG. 2A, first oxide film 200 may be formed on and/or over a semiconductor substrate. According to embodiments, aluminum (Al) and/or aluminum-copper (AlCu) layer 202 may be formed on and/or over first oxide film 200. In embodiments, a mask may be deposited on and/or over aluminum layer 202. In embodiments, primary etching may be performed to form a lower metal wire.

According to embodiments, second oxide film 206 may be formed on and/or over a surface, which may be the entire surface, of first oxide film 200 and/or aluminum layer 202. In embodiments, etching may be performed with respect to a MIM region to remove second oxide film 206 until a surface of aluminum layer 202 is exposed with respect to a region where a hole may be formed. In embodiments, exposed aluminum layer 202 within a hole may be etched to a prescribed depth. In embodiments, after secondary etching may be performed on and/or over a region where a MIM structure may be formed on and/or over aluminum layer 202 after a primary etching, a next process may be performed. In embodiments, the next process may be modified in accordance with a way of implementing embodiments.

Figure 2B:
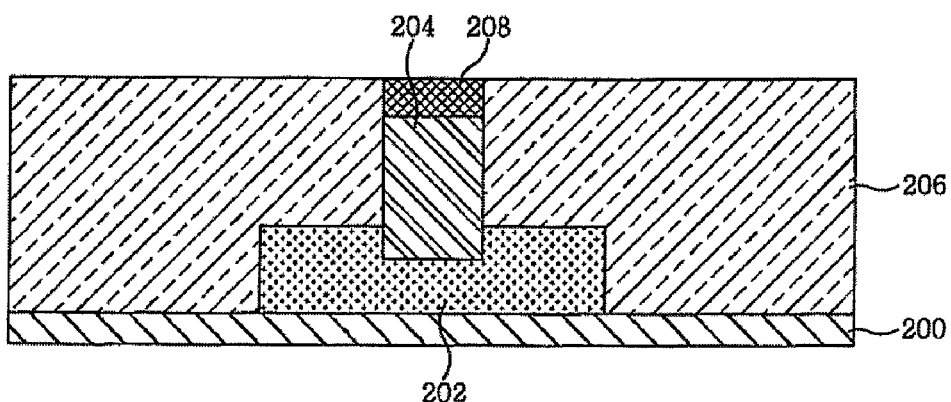

According to embodiments, a conductive material, such as tungsten (W) layer 204, may be filled on and/or over a hole. In embodiments, filled tungsten layer 204 may be a lower metal layer of a MIM structure. In embodiments, filled tungsten layer 204 may be etched to a prescribed depth to form a recess. Referring to FIG. 2B, tungsten layer 204 may be etched, and/or silicon nitride film (SiN) 208 may be deposited in a recess. In embodiments, silicon nitride film 208 may be a inter-metal dielectric (insulator) of a MIM structure.

Figure 2C:
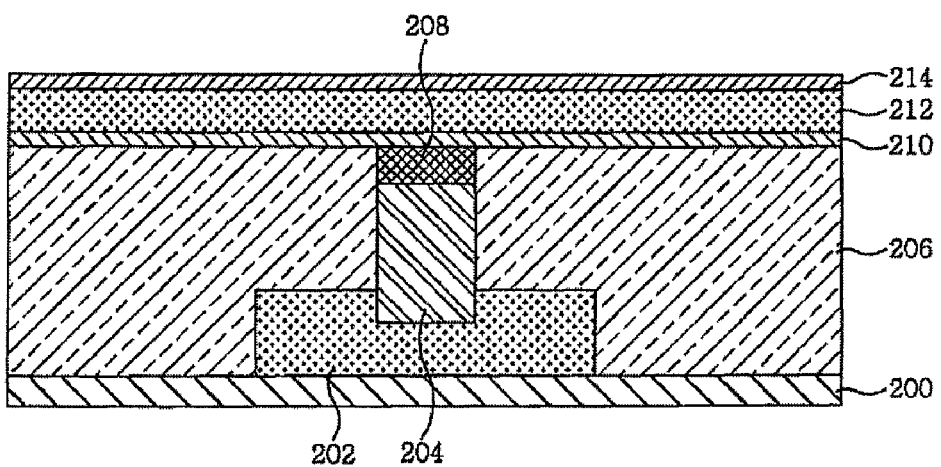

Referring to FIG. 2C, a Ti and/or titanium nitride (TiN) layer 210 may be formed on and/or over second oxide film 206 and/or SiN layer 208, for example after SiN layer 208 may be deposited. In embodiments, aluminum (Al) and/or aluminum-copper (AlCu) 212 may be formed on and/or over Ti and/or TiN layer 210. In embodiments, Ti and/or TiN layer 214 may be formed on and/or over aluminum (Al) and/or aluminum-copper (AlCu) layer 212. In embodiments, Ti and/or TiN layer 210, aluminum (Al) and/or aluminum-copper (AlCu) layer 212 and/or Ti and/or TiN layer 214 which may be formed, for example sequentially, may be etched, for example sequentially, by patterning, and/or may be an upper metal layer of a MIM structure.

Figure 2D:
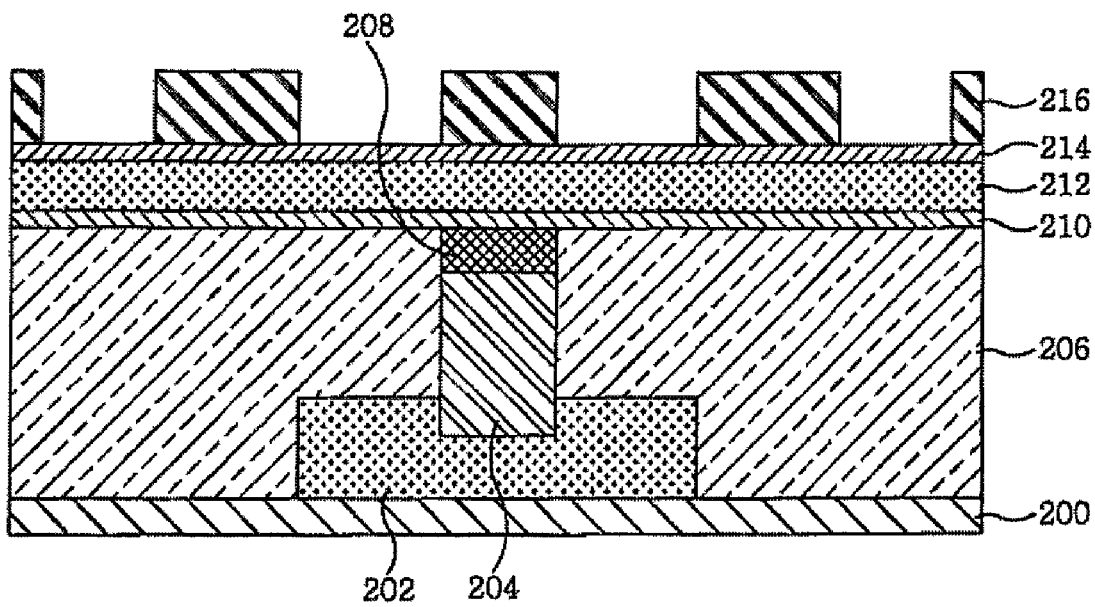
Figure 2E:
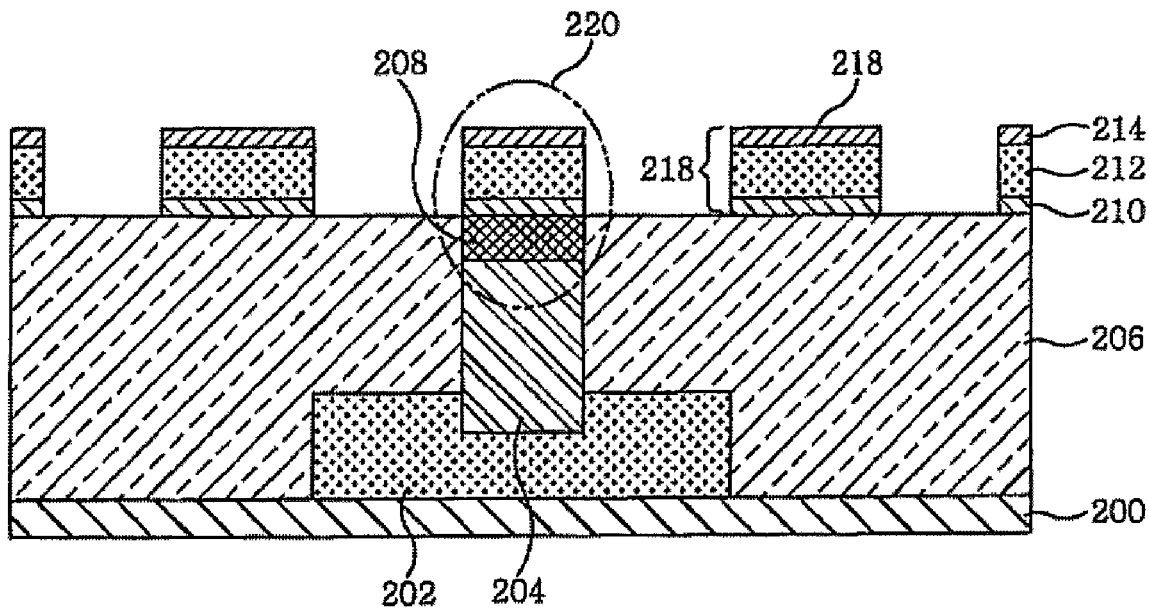

Referring to FIG. 2D, a photoresist may be deposited on and/or over a semiconductor substrate over which Ti and/or TiN layer 210, aluminum (Al) and/or aluminum-copper (AlCu) layer 212 and/or Ti and/or TiN layer 214, which may be sequentially formed. According to embodiments, pattern 216 to form a MIM structure and a metal layer may be formed. Referring to FIG. 2E, dry etching may be performed using photoresist pattern 216 as a mask, for example after a pattern is formed. In embodiments, MIM capacitor 220 and metal layer 218 may be formed using a single process. In embodiments, a MIM structure and a metal layer may be formed using a single process. In embodiments, a MIM structure and metal layer may be formed at substantially the same time within a hole using a single photoresist pattern.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. An apparatus comprising:
a lower metal wire over a semiconductor substrate;
an oxide film comprising a hole over said lower metal wire, wherein the hole includes a recess formed in the lower metal wire and forming a bottom of the hole;
a lower metal layer formed in the hole and filling the recess, wherein a top surface of the lower metal layer is located below a top surface of the oxide film;
an inter-metal dielectric over said lower metal layer and in the hole, wherein a top surface of the inter-metal dielectric and the top surface of the oxide film are located on substantially the same plane; and
an upper metal layer over said inter-metal dielectric.

2. The apparatus of claim 1, wherein said lower metal wire comprises at least one of a aluminum and a aluminum-copper layer formed over an oxide film.

3. The apparatus of claim 1, wherein:
said oxide film is etched to form said hole to a surface of said lower metal wire;
said lower metal wire is etched to a prescribed depth to form the recess; and
said inter-metal dielectric is formed over the recess.

4. The apparatus of claim 1, wherein said lower metal layer comprises tungsten.

5. The apparatus of claim 1, wherein said inter-metal dielectric comprises a silicon nitride film.

6. The apparatus of 1, wherein said upper metal layer comprises a structure in which at least one of a titanium and titanium nitride layer, at least one of a aluminum and a aluminum-copper layer, and at least one of a titanium and a titanium nitride layer are sequentially formed.

7. The apparatus of claim 1, comprising a photoresist pattern over said upper metal layer configured to form a MIM capacitor in an etching process.

8. The apparatus of claim 7, wherein said photoresist pattern is a pattern configured to form a MIM structure and a metal layer structure at substantially the same time in said etching process.

9. The apparatus of claim 7, wherein said etching process comprises dry etching including plasma.

10. The apparatus of claim 1, wherein said upper metal layer is spaced apart from a metal layer structure formed over said inter-metal dielectric.

11. A method comprising:
forming a lower metal wire over a semiconductor substrate;
forming an oxide film comprising a hole over said lower metal wire, wherein the hole includes a recess formed in the lower metal wire and forming a bottom of the hole;
forming a lower metal layer in the hole to fill the recess;
etching the lower metal layer so that a top surface of the lower metal layer is located below a top surface of the oxide film;
forming an inter-metal dielectric over said lower metal layer and in the hole so that a top surface of the inter-metal dielectric and the top surface of the oxide film are located on substantially the same plane; and
forming an upper metal layer over said inter-metal dielectric.

12. The method of claim 11, wherein:
said oxide film is etched to form the hole to a surface of said lower metal wire;
said lower metal wire is etched to a prescribed depth to form the recess; and
said inter-metal dielectric is formed over the recess.

13. The method of claim 11, wherein forming said lower metal wire comprises forming at least one of a aluminum and a aluminum-copper layer over said oxide film.

14. The method of claim 11, wherein said lower metal layer comprises tungsten.

15. The method of claim 11, wherein said inter-metal dielectric comprises a silicon nitride film.

16. The method of claim 11, wherein said upper metal layer comprises a structure in which at least one of a titanium and a titanium nitride layer, at least one of a aluminum and a aluminum-copper layer, and at least one of a titanium and a titanium nitride layer are sequentially formed.

17. The method of claim 11, comprising performing etching including a photoresist pattern over said upper metal layer.

18. The method of claim 17, wherein said photoresist pattern comprises a pattern in which a MIM structure and a metal layer structure are formed at substantially the same time.

19. The method of claim 17, wherein performing said etching comprises dry etching including plasma.

20. The method of claim 11, wherein said upper metal layer is spaced apart from a metal layer structure formed over said inter-metal dielectric.

* * * * *